(12) United States Patent
Nagamizu et al.

(10) Patent No.: US 10,319,661 B2
(45) Date of Patent: Jun. 11, 2019

(54) SEMICONDUCTOR DEVICE AND METHOD OF MANUFACTURING THE SAME

(71) Applicant: Mitsubishi Electric Corporation, Tokyo (JP)

(72) Inventors: Hayato Nagamizu, Fukuoka (JP); Takuro Mori, Fukuoka (JP); Yoshitaka Otsubo, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/725,303

(22) Filed: Oct. 5, 2017

(65) Prior Publication Data

US 2018/0204782 A1    Jul. 19, 2018

(30) Foreign Application Priority Data

Jan. 19, 2017 (JP) ................. 2017-007666

(51) Int. Cl.
*H01L 23/36* (2006.01)
*H01L 23/492* (2006.01)
(Continued)

(52) U.S. Cl.
CPC .......... *H01L 23/36* (2013.01); *H01L 21/4882* (2013.01); *H01L 23/049* (2013.01);
(Continued)

(58) Field of Classification Search
None
See application file for complete search history.

(56) References Cited

U.S. PATENT DOCUMENTS

2008/0217760 A1   9/2008   Yoshihara et al.
2009/0212411 A1*  8/2009   Matsumoto .......... H01L 23/053
                                                      257/690
(Continued)

FOREIGN PATENT DOCUMENTS

JP    2008-252055 A    10/2008
JP    2009-021286 A     1/2009
(Continued)

OTHER PUBLICATIONS

MTD 2009-021286 (2009).*

*Primary Examiner* — Ahmed N Sefer
(74) *Attorney, Agent, or Firm* — Studebaker & Brackett PC

(57) ABSTRACT

In a semiconductor device, an outer peripheral case body has guiding portions formed therein as a plurality of recesses. The plurality of guiding portions each include an upper end opening. The outer peripheral case body has inner peripheral side openings formed in its inner peripheral surface, each of which is continuous with the upper end opening, extends from an upper end face toward a base body and is continuous with the guiding portion. The first insertion portion is inserted into a first guiding portion of the plurality of guiding portions. The first external terminal portion is continuous with the first insertion portion and extends through the upper end opening in the first guiding portion to outside of the outer peripheral case body. The first connection terminal portion is continuous with the first insertion portion and connected to a conductive pattern through the inner peripheral side opening.

15 Claims, 7 Drawing Sheets

(51) Int. Cl.
*H01L 21/48* (2006.01)
*H01L 23/498* (2006.01)
*H01L 23/049* (2006.01)
*H01L 23/373* (2006.01)
*H01L 21/56* (2006.01)
*H01L 23/31* (2006.01)
*H01L 23/24* (2006.01)
*H01L 23/053* (2006.01)

(52) U.S. Cl.
CPC ........ *H01L 23/3735* (2013.01); *H01L 23/492* (2013.01); *H01L 23/49811* (2013.01); *H01L 23/49838* (2013.01); *H01L 21/56* (2013.01); *H01L 23/053* (2013.01); *H01L 23/24* (2013.01); *H01L 23/3107* (2013.01); *H01L 2224/48091* (2013.01)

(56) References Cited

U.S. PATENT DOCUMENTS

| | | | |
|---|---|---|---|
| 2013/0049201 A1* | 2/2013 | Yoshida | H01L 23/49811 257/751 |
| 2013/0069215 A1* | 3/2013 | Nakao | H01L 23/049 257/687 |
| 2014/0118956 A1* | 5/2014 | Kim | H01L 23/049 361/728 |
| 2014/0167242 A1* | 6/2014 | Kim | H01L 23/053 257/690 |
| 2014/0299982 A1* | 10/2014 | Minamio | H01L 25/165 257/712 |
| 2016/0095213 A1* | 3/2016 | Otsubo | H01L 23/49811 361/707 |

FOREIGN PATENT DOCUMENTS

| | | | | |
|---|---|---|---|---|
| JP | 2009-130007 | * | 6/2009 | |
| JP | 2013-171870 A | | 9/2013 | |
| WO | WO 2011/149017 | * | 12/2011 | ........... H01L 23/049 |

* cited by examiner

SEMICONDUCTOR DEVICE AND METHOD OF MANUFACTURING THE SAME

BACKGROUND OF THE INVENTION

Field of the Invention

The present invention relates to semiconductor devices and methods of manufacturing the same, and more particularly to a semiconductor device having a semiconductor element disposed inside a case body and a method of manufacturing the same.

Description of the Background Art

Conventionally, there has been known a semiconductor device having a structure in which the outer periphery of an insulated circuit board with a semiconductor element mounted thereon is surrounded by a case body (see Japanese Patent Laying-Open Nos. 2008-252055, 2009-21286 and 2013-171870, for example).

SUMMARY OF THE INVENTION

Japanese Patent Laying-Open No. 2008-252055 employs a structure in which an external connection terminal and a substrate with a semiconductor element mounted thereon are connected by a conductive material such as a bonding wire. When dissipating heat from the semiconductor element to the outside through the connection terminal in this structure, the heat dissipation depends on the heat dissipation performance of the conductive material. Thus, the heat dissipation may not be sufficient to meet market needs depending on the heat dissipation performance of the conductive material. A conductive material is connected usually by ultrasonic vibration. In this instance, a connection terminal needs to be strongly fixed to a case body, which requires steps such as applying an adhesive for fixing the connection terminal and inserting a fixing cover for fixing the terminal, thus disadvantageously resulting in an increased number of components and steps. In addition, constraints may be imposed on materials for the case body. That is, a highly rigid material for the case body may cause bending of the terminal, cracking of the case and the like due to press fitting during the fixation of the terminal and the like, resulting in reduced reliability of the semiconductor device.

As to Japanese Patent Laying-Open No. 2009-21286, when fixing a terminal to a case body, the terminal is fixed to a predetermined recess in the case body by elastically deforming the case body partially. Thus, an elastic body needs to be used as a material for the case. For this reason, the semiconductor device disclosed in Japanese Patent Laying-Open No. 2009-21286 has a low material selectivity for the case body, which may result in problems such as increased cost and reduced reliability of the semiconductor device.

As to Japanese Patent Laying-Open No. 2013-171870, a step of fixing a terminal includes a step of bending the terminal, thus disadvantageously resulting in an increased number of steps of manufacturing the semiconductor device. In addition, since an external force is applied to the terminal during the bending of the terminal, this external force may affect the integrity of the terminal, and in turn the reliability of the semiconductor device. Japanese Patent Laying-Open No. 2013-171870 does not consider flexibly changing the position of the terminal.

The present invention has been made to solve the problems as described above, and an object of the present invention is to provide a semiconductor device capable of achieving good heat dissipation, high design flexibility and low cost, and a method of manufacturing the same.

A semiconductor device according to the present disclosure includes a base body, an insulating plate, a conductor layer, a semiconductor element, an outer peripheral case body, a terminal component, and a resin layer. The insulating plate is disposed on a surface of the base body. The conductor layer is formed on a surface of the insulating plate. The semiconductor element is connected to the conductor layer. The outer peripheral case body is disposed to surround an outer periphery of the base body. The outer peripheral case body has a plurality of recesses formed therein. The plurality of recesses each include an upper end opening that opens at an upper end face of the outer peripheral case body opposite to the base body. The outer peripheral case body has inner peripheral side openings formed in its inner peripheral surface, each of which is continuous with the upper end opening, extends from the upper end face toward the base body and is continuous with the recess. In a circumferential direction of the outer peripheral case body, the inner peripheral side opening has a width narrower than a width of the recess. The terminal component includes a first insertion portion, a first external terminal portion, and a first connection terminal portion. The first insertion portion is inserted into a first recess of the plurality of recesses. The first external terminal portion is continuous with the first insertion portion and extends through the upper end opening in the first recess to outside of the outer peripheral case body. The first connection terminal portion is continuous with the first insertion portion, extends through the inner peripheral side opening onto the conductor layer and is connected to the conductor layer. The resin layer at least seals the semiconductor element and the first connection terminal portion in a region surrounded by the insulating plate and the outer peripheral case body.

In a method of manufacturing a semiconductor device according to the present disclosure, a stacked body is prepared. The stacked body includes a base body, an insulating plate, a conductor layer, and a semiconductor element. The insulating plate is disposed on a surface of the base body. The conductor layer is formed on a surface of the insulating plate. The semiconductor element is connected to the conductor layer. In the method of manufacturing a semiconductor device, an outer peripheral case body is connected to the stacked body so as to surround an outer periphery of the base body. The outer peripheral case body has a plurality of recesses formed therein. The plurality of recesses each include an upper end opening that opens at an upper end face of the outer peripheral case body opposite to the base body. The outer peripheral case body has inner peripheral side openings formed in its inner peripheral surface, each of which is continuous with the upper end opening, extends from the upper end face toward the base body and is continuous with the recess. In a circumferential direction of the outer peripheral case body, the inner peripheral side opening has a width narrower than a width of the recess. In the method of manufacturing a semiconductor device described above, a terminal component is inserted through the upper end opening into a first recess of the plurality of recesses. The terminal component includes a first insertion portion, a first external terminal portion, and a first connection terminal portion. The first insertion portion is inserted into the first recess. The first external terminal portion is continuous with the first insertion portion and extends through the upper end opening in the first recess to outside of the outer peripheral case body. The first connection terminal portion is continuous with the first insertion portion, and extends through the inner peripheral side opening onto the conductor layer. In the method of manufacturing a semiconductor device, the first connection terminal portion and the conductor layer are connected. Furthermore, in the method of manufacturing a semiconductor device, a resin layer at least sealing the semiconductor element and the first connection terminal portion in a region surrounded by the insulating plate and the outer peripheral case body is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
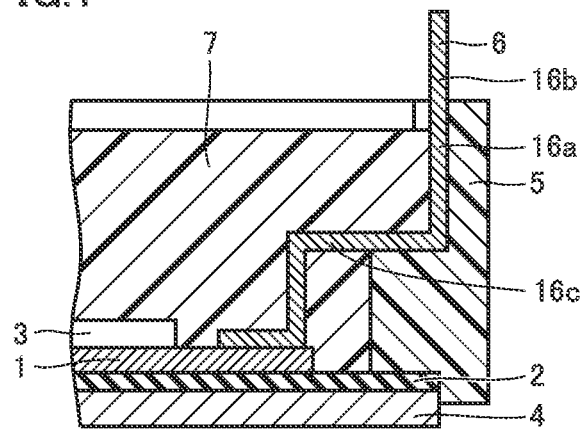
FIG. 1 is a partial schematic sectional view of a semiconductor device according to a first embodiment of the present invention.

Embodiments of the present invention will be described below with reference to the drawings. In the following drawings, the same or corresponding elements are denoted by the same reference numerals and description thereof will not be repeated. In the following drawings, including FIG. 1, size relationships among the components may be different from the actual relationships. Moreover, the forms of components represented throughout the specification are merely exemplary and are not limited to these descriptions.

First Embodiment

<Configuration of Semiconductor Device>

Figure 2:
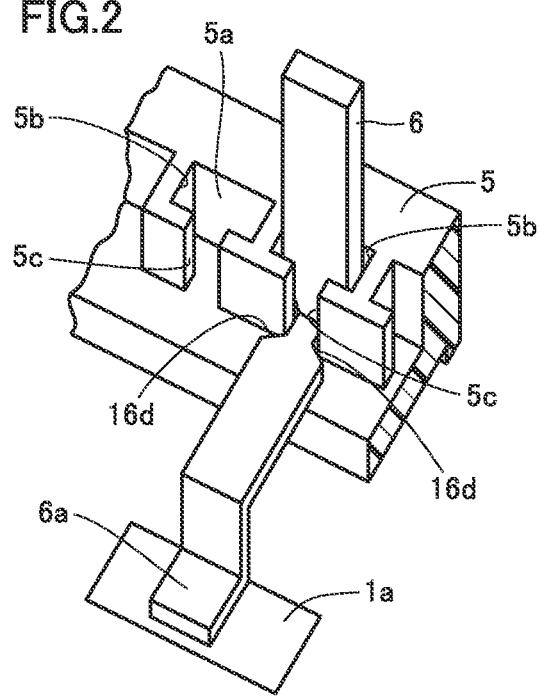
FIG. 2 is a partial schematic perspective view of the semiconductor device shown in FIG. 1.

FIG. 1 is a partial schematic sectional view of a semiconductor device according to a first embodiment of the present invention. FIG. 2 is a partial schematic perspective view of the semiconductor device shown in FIG. 1. FIG. 1 shows a cross section of the semiconductor device that has been cut perpendicularly to a base plate 4. In the semiconductor device shown in FIG. 1, an insulating plate 2 having a conductive pattern 1, and a semiconductor chip 3 are mounted on base plate 4, and an outer peripheral case body 5 is bonded to base plate 4 so as to surround the outer periphery of base plate 4. An external connection terminal 6 (hereinafter also referred to as terminal 6) disposed along outer peripheral case body 5 has one end electrically connected to conductive pattern 1. The inner peripheral side of outer peripheral case body 5 is sealed with a thermosetting resin layer 7.

FIG. 2 shows terminal 6 as inserted along a guiding portion 5a, which is a recess for terminal positioning formed in outer peripheral case body 5. In FIG. 2, terminal 6 has one end, a connection portion 6a, electrically connected to an arbitrary connection location 1a on conductive pattern 1 (see FIG. 1). Although it is desirable that the shape of connection portion 6a of terminal 6 with the conductive pattern be as large as possible as shown in FIG. 2, a connection portion 6c as shown in FIG. 3 may be employed in view of the ease of connection.

Figure 3:
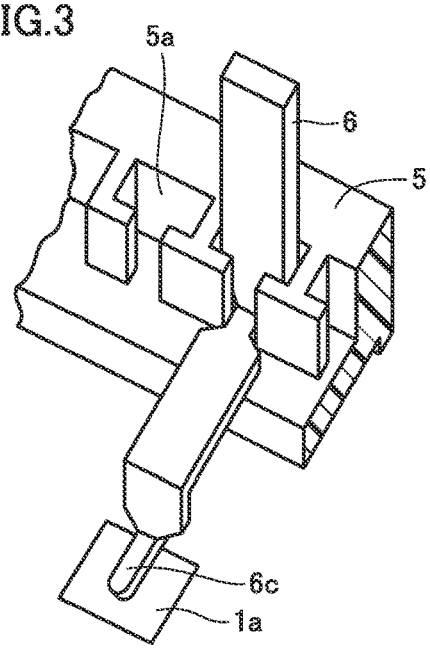
FIG. 3 is a partial schematic perspective view showing a variation of the semiconductor device shown in FIGS. 1 and 2.

Here, FIG. 3 is a partial schematic perspective view showing a variation of the semiconductor device shown in FIGS. 1 and 2. In FIG. 3, connection portion 6c of terminal 6 has a width narrower than the width of connection portion 6a of terminal 6 shown in FIG. 2. Again, with such a configuration, sufficient heat dissipation effect can be provided through terminal 6.

<Function and Effect of Semiconductor Device>

The semiconductor device according to the present disclosure includes base plate 4 as a base body, insulating plate 2, conductive pattern 1 as a conductor layer, semiconductor chip 3 as a semiconductor element, outer peripheral case body 5, external connection terminal 6 as a terminal component, and resin layer 7. Insulating plate 2 is disposed on the surface of base plate 4. Conductive pattern 1 is formed on the surface of insulating plate 2. Semiconductor chip 3 is connected to conductive pattern 1. Outer peripheral case body 5 is disposed to surround the outer periphery of base plate 4. Outer peripheral case body 5 has guiding portions 5a formed therein as a plurality of recesses. The plurality of guiding portions 5a each include an upper end opening 5b that opens at an upper end face of outer peripheral case body 5 opposite to base plate 4. Outer peripheral case body 5 has inner peripheral side openings 5c formed in its inner peripheral surface, each of which is continuous with upper end opening 5b, extends from the upper end face toward base plate 4 and is continuous with guiding portion 5a. In a circumferential direction of outer peripheral case body 5, inner peripheral side opening 5c has a width narrower than the width of guiding portion 5a. External connection terminal 6 includes a first insertion portion 16a, a first external terminal portion 16b, and a first connection terminal portion 16c. First insertion portion 16a is inserted into a first guiding portion 5a of the plurality of guiding portions 5a. First external terminal portion 16b is continuous with first insertion portion 16a, and extends through upper end opening 5b in first guiding portion 5a to the outside of outer peripheral case body 5. First connection terminal portion 16c is continuous with first insertion portion 16a, extends through inner peripheral side opening 5c onto conductive pattern 1 and is connected to conductive pattern 1. Resin layer 7 at least seals semiconductor chip 3 and first connection terminal portion 16c in a region surrounded by insulating plate 2 and outer peripheral case body 5.

With such a configuration, by disposing external connection terminal 6 at an arbitrary position of the plurality of guiding portions 5a of outer peripheral case body 5, the design flexibility with regard to the placement of external connection terminal 6 can be increased. In addition, since first connection terminal portion 16c of external connection terminal 6 is connected to conductive pattern 1, constraints on the heat dissipation performance can be reduced as compared to when external connection terminal 6 and conductive pattern 1 are connected through a wire or the like. The heat dissipation from external connection terminal 6 can thereby be increased. In addition, first insertion portion 16a of external connection terminal 6 can be inserted through upper end opening 5b into first guiding portion 5a, where a bending process or the like of external connection terminal 6 is not particularly required. Furthermore, since there is no need for a step of elastically deforming outer peripheral case body 5 when inserting first insertion portion 16a of external connection terminal 6 into guiding portion 5a, a material other than an elastic body can be applied as a material for outer peripheral case body 5. A high flexibility of selection of the material for outer peripheral case body 5 can thereby be provided. In this manner, the semiconductor device capable of achieving good heat dissipation, high design flexibility and low cost can be obtained.

In the semiconductor device described above, a notch 16d is formed at the boundary between first insertion portion 16a and first connection terminal portion 16c. A portion of outer peripheral case body 5 that forms the sidewalls of inner peripheral side opening 5c is partially disposed on the inner side of notch 16d. In this instance, since outer peripheral case body 5 is partially disposed inside notch 16d, external connection terminal 6 can be readily positioned relative to outer peripheral case body 5. In this manner, the semiconductor device described above achieves good heat dissipation of external connection terminal 6, low cost, and selection of various materials for outer peripheral case body 5, and can flexibly address a variety of terminal placements of external connection terminal 6.

Stated from a different perspective, in the structure of the semiconductor device shown in FIGS. 1 and 2, since external connection terminal 6 is directly connected to conductive pattern 1, heat generated at external connection terminal 6 can be readily transferred to base plate 4, to thereby suppress heat generation at the terminal. In addition, since external connection terminal 6 is inserted into guiding portion 5a after outer peripheral case body 5 has been bonded to base plate 4 as will be described later, various pin layouts can be selected during manufacture. Accordingly, a variety of pin layout requests in the semiconductor device can be flexibly addressed.

Here, in the conventional structure such as described in Japanese Patent Laying-Open No. 2008-252055, it is required to connect a conductive material such as a bonding wire between external connection terminal 6 and conductive pattern 1, and it is required for external connection terminal 6 to be strongly fixed during the connection of the bonding wire. In the present embodiment, however, there is no such a step of connecting a conductive material, and thus there is no need to strongly fix external connection terminal 6. Furthermore, the conventional structures disclosed in Japanese Patent Laying-Open Nos. 2008-252055 and 2009-21286 employ a method of press-fitting external connection terminal 6 into outer peripheral case body 5, and a method of inserting external connection terminal 6 into outer peripheral case body 5 having a pawl formed of an elastic member, for the strong fixation of external connection terminal 6. When such methods are used, external connection terminal 6 may be broken, or outer peripheral case body 5 may be broken, during the press-fitting of external connection terminal 6 into outer peripheral case body 5 made of a highly rigid material. In the present embodiment that does not require such a press-fitting step, outer peripheral case body 5 molded with a highly rigid material, for example, a material such as PPS (polyphenylene sulfide), can be used without the possibility of breakage. For the strong fixation of external connection terminal 6, it may be possible, other than the press-fitting, to bond external connection terminal 6 to outer peripheral case body 5 by an adhesive and the like, or to fix external connection terminal 6 by inserting a cover. The present embodiment, however, does not require these steps and components such as a cover, thus allowing reduced cost of the semiconductor device.

<Configuration and Function and Effect of Variation of Semiconductor Device>

In the semiconductor device described above, an integrated insulating base plate, which has a structure in which insulating plate 2 and base plate 4 made of copper or the like are integrated together, may be used as the base plate. That is, base plate 4 and insulating plate 2 may be integrated together in the semiconductor device described above. In this instance, the step of connecting base plate 4 and insulating plate 2 can be eliminated, and the components can be handled more easily, thus allowing reduced manufacturing cost of the semiconductor device. A resin insulator such as epoxy resin, or a ceramic insulator such as silicon nitride, aluminum nitride and alumina is used as insulating plate 2.

<Method of Manufacturing Semiconductor Device>

Figure 4:
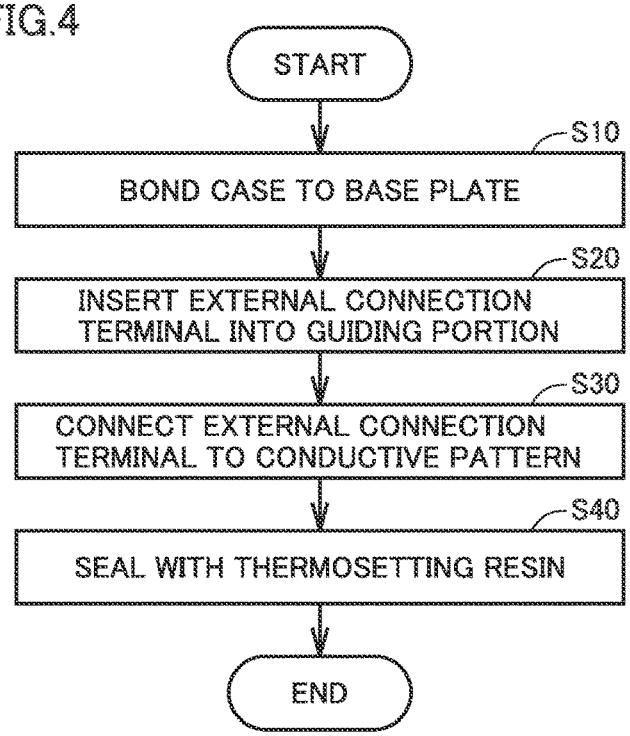
FIG. 4 is a flowchart for illustrating a method of manufacturing the semiconductor device according to the first embodiment of the present invention.
Figure 5:
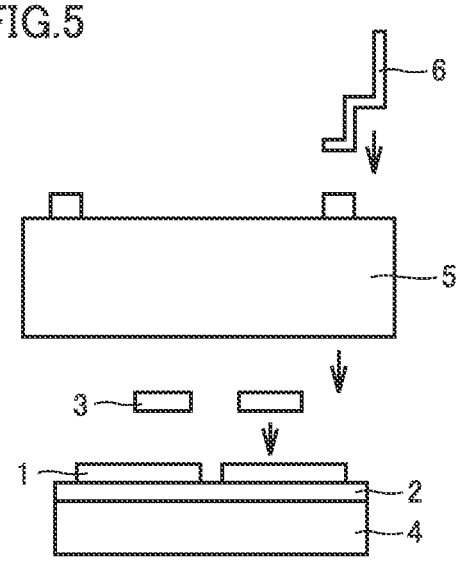
FIG. 5 is a schematic diagram for illustrating the method of manufacturing the semiconductor device shown in FIG. 4.
Figure 6:
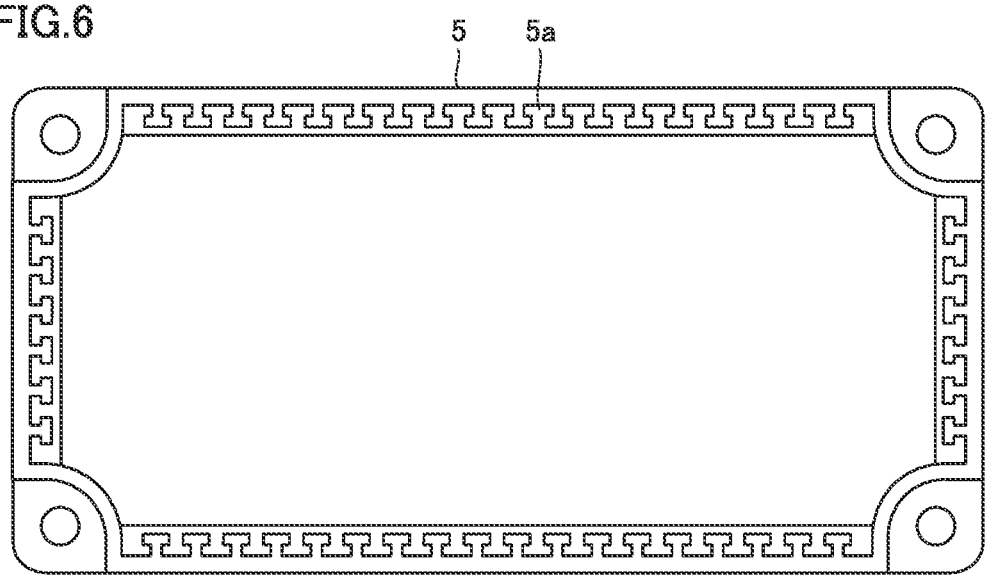
FIG. 6 is a schematic diagram for illustrating the method of manufacturing the semiconductor device shown in FIG. 4.
Figure 7:
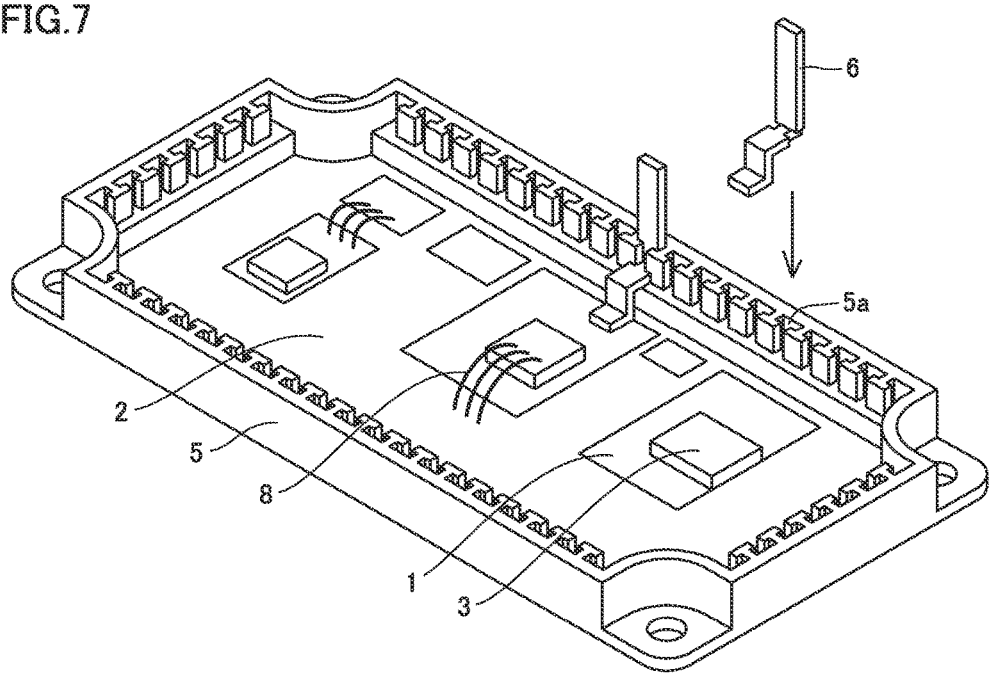
FIG. 7 is a schematic perspective view for illustrating the method of manufacturing the semiconductor device shown in FIG. 4.

FIG. 4 is a flowchart for illustrating a method of manufacturing the semiconductor device according to the first embodiment of the present invention. FIGS. 5 and 6 are schematic diagrams for illustrating the method of manufacturing the semiconductor device shown in FIG. 4. FIG. 7 is a schematic perspective view for illustrating the method of manufacturing the semiconductor device shown in FIG. 4. The method of manufacturing the semiconductor device according to the present embodiment will be described using FIGS. 4 to 7.

First, a step of bonding the case to the base plate (S10) shown in FIG. 4 is performed. In this step (S10), base plate 4 with insulating plate 2 and conductive pattern 1 formed thereon is prepared as shown in FIG. 5, and outer peripheral case body 5 is attached to this base plate 4. The connection between outer peripheral case body 5 and base plate 4 may be made using an adhesive, or by employing any other connection method. A resin insulator such as epoxy resin, or a ceramic insulator such as silicon nitride, aluminum nitride and alumina is used as insulating plate 2. In the step of bonding outer peripheral case body 5 to base plate 4, a silicon adhesive, for example, may be applied to the edge of outer peripheral case body 5, which may then be joined and bonded to base plate 4.

Next, a step of inserting the external connection terminal into the guiding portion (S20) is performed. In this step (S20), as shown in FIGS. 5 and 7, external connection terminal 6 is arranged at an arbitrary location along the plurality of guiding portions 5a provided in advance in the outer periphery of outer peripheral case body 5. That is, when attaching external connection terminal 6 to the semiconductor device, first, outer peripheral case body 5 is attached onto base plate 4 with insulating plate 2 and conductive pattern 1 formed thereon in the step (S10), as shown in FIG. 5, and then, external connection terminal 6 is inserted and fixed into predetermined guiding portion 5a of outer peripheral case body 5. External connection terminal 6 is positioned such that connection portion 6a of external connection terminal 6 is positioned over conductive pattern 1. When outer peripheral case body 5 is viewed from above, the plurality of terminal guiding portions 5a are regularly formed in advance in the outer peripheral portion of outer peripheral case body 5 as shown in FIG. 6.

Next, a step of connecting the external connection terminal to the conductive pattern (S30) is performed. In this step (S30), connection terminal portion 16c of external connection terminal 6, specifically, connection portion 6a which is a tip portion of connection terminal portion 16c, is electrically connected directly to conductive pattern 1. Any method can be employed in this connection step. For example, a joining method using solder or an ultrasonic bonding method can be used.

Next, a step of sealing with thermosetting resin (S40) is performed. In this step (S40), thermosetting resin is introduced to fill the inside of outer peripheral case body 5 so as to cover conductive pattern 1, and this resin is cured by being heated and cooled to serve as resin layer 7. The sealing of the semiconductor device and the fixation of external connection terminal 6 are performed in this manner. Epoxy resin is used, for example, as the thermosetting resin. Epoxy resin has high thermal conductivity, and exhibits an excellent degree of adhesion and strength during curing as compared to resin such as silicon gel. When epoxy resin is used for resin layer 7 serving as a sealing material, the heat dissipation will be improved and excessive contraction will be suppressed around semiconductor chip 3 by these characteristics, so that advantages such as improved reliability are expected. In this manner, the semiconductor device shown in FIG. 1 and the like can be obtained.

To summarize the characteristic features of the method of manufacturing the semiconductor device described above, in the method of manufacturing the semiconductor device according to the present disclosure, the step of preparing a stacked body (S10) is performed. The stacked body includes base plate 4, insulating plate 2, conductive pattern 1 as a conductor layer, and semiconductor chip 3 as a semiconductor element. Insulating plate 2 is disposed on the surface of base plate 4. Conductive pattern 1 is formed on the surface of insulating plate 2. Semiconductor chip 3 is connected to conductive pattern 1. In the method of manufacturing the semiconductor device, the step of connecting outer peripheral case body 5 to the stacked body so as to surround the outer periphery of the base body (S10) is performed. Outer peripheral case body 5 has guiding portions 5a formed therein as a plurality of recesses, as shown in FIG. 6 and the like. The plurality of guiding portions 5a each include upper end opening 5b that opens at the upper end face of outer peripheral case body 5 opposite to base plate 4. Outer peripheral case body 5 has inner peripheral side openings 5c formed in its inner peripheral surface, each of which is continuous with upper end opening 5b, extends from the upper end face toward base plate 4 and is continuous with guiding portion 5a. In the circumferential direction of outer peripheral case body 5, inner peripheral side opening 5c has a width narrower than the width of guiding portion 5a. In the method of manufacturing the semiconductor device described above, the step of inserting external connection terminal 6 as a terminal component through upper end opening 5b into first guiding portion 5a of the plurality of guiding portions 5a (S20) is performed. External connection terminal 6 includes first insertion portion 16a, first external terminal portion 16b, and first connection terminal portion 16c. First insertion portion 16a is inserted into first guiding portion 5a. First external terminal portion 16b is continuous with first insertion portion 16a, and extends through upper end opening 5b in first guiding portion 5a to the outside of outer peripheral case body 5. First connection terminal portion 16c is continuous with first insertion portion 16a, and extends through inner peripheral side opening 5c onto conductive pattern 1. In the method of manufacturing the semiconductor device, the step of connecting first connection terminal portion 16c to conductive pattern 1 (S30) is performed. Furthermore, in the method of manufacturing the semiconductor device, the step of forming resin layer 7 that at least seals semiconductor chip 3 and first connection terminal portion 16c in the region surrounded by insulating plate 2 and outer peripheral case body 5 (S40) is performed. In this manner, the semiconductor device according to the present disclosure can be obtained.

Second Embodiment

<Configuration of Semiconductor Device>

Figure 8:
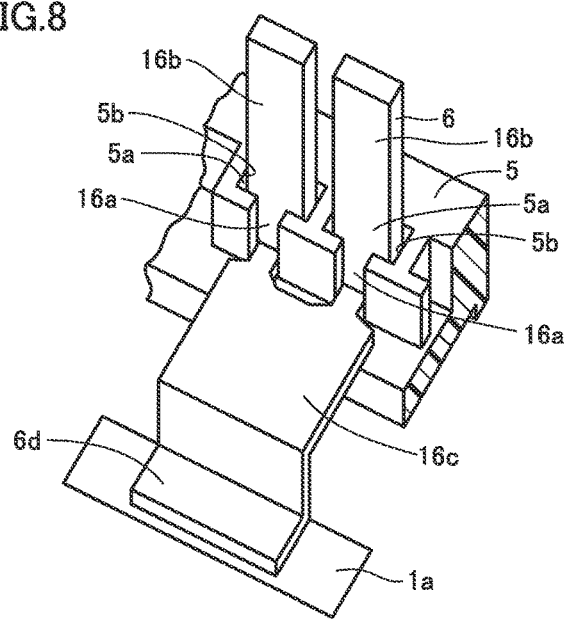
FIG. 8 is a partial schematic perspective view of a semiconductor device according to a second embodiment of the present invention.
Figure 9:
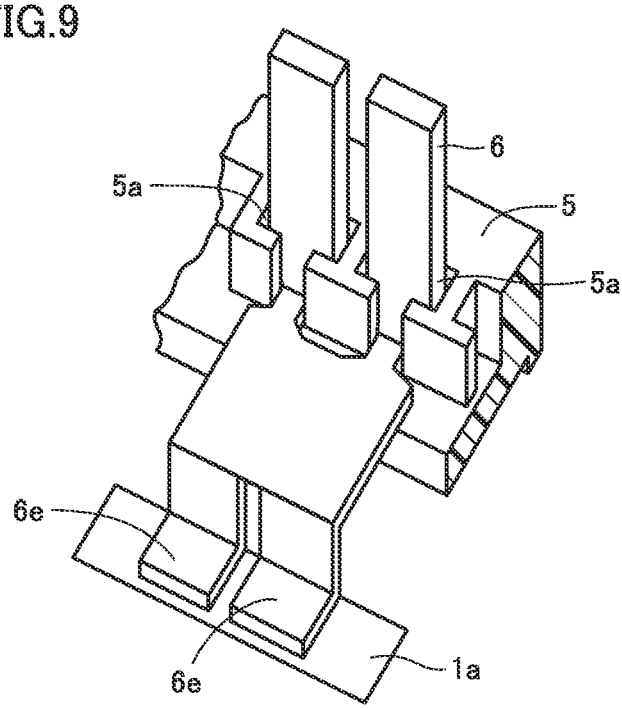
FIG. 9 is a partial schematic perspective view showing a variation of the semiconductor device shown in FIG. 8.

FIG. 8 is a partial schematic perspective view of a semiconductor device according to a second embodiment of the present invention. FIG. 9 is a partial schematic perspective view showing a variation of the semiconductor device shown in FIG. 8.

The semiconductor device shown in FIG. 8 basically has a configuration similar to that of the semiconductor device shown in FIGS. 1 and 2, but differs from the semiconductor device shown in FIG. 1 in the shape of external connection terminal 6. That is, the semiconductor device shown in FIG. 8 uses a terminal having a plurality of insertion portions 16a coupled at connection terminal portion 16c on the inner side of outer peripheral case body 5, as a terminal inserted into two adjacent guiding portions 5a of outer peripheral case body 5 as shown in FIG. 8, in order to improve the heat dissipation. This terminal branches off above guiding portions 5a of outer peripheral case body 5. In this instance, a heat dissipation area is increased to improve the heat dissipation of external connection terminal 6, as compared to when external connection terminals 6 independent for each of the plurality of guiding portions 5a are aligned and disposed.

In addition, as shown in FIG. 8, it is preferable to have a large joint site 6d between external connection terminal 6 and conductive pattern 1. However, heat generated from external connection terminal 6 is dissipated not only through conductive pattern 1 but also through resin layer 7 serving as a sealing material. Thus, it may also be possible to use external connection terminal 6 having a plurality of separated joint sites 6e, as in the semiconductor device shown in FIG. 9. The effect of sufficiently improving the heat dissipation can be provided in this instance as well. For example, external connection terminal 6 which is a coupled terminal as shown in FIGS. 8 and 9 may be used only for portions required to have high heat dissipation, and external connection terminals 6 independent for each of guiding portions 5a may be used for the other portions.

<Function and Effect of Semiconductor Device>

In the semiconductor device described above, the plurality of guiding portions 5a include a second guiding portion 5a adjacent to first guiding portion 5a as shown in FIGS. 8 and 9. For example, in FIGS. 8 and 9, first guiding portion 5a and second guiding portion 5a are aligned from the right side. External connection terminal 6 includes a second insertion portion 16a and a second external terminal portion 16b. Second insertion portion 16a is inserted into second guiding portion 5a. Second external terminal portion 16b is continuous with second insertion portion 16a, and extends through upper end opening 5b in second guiding portion 5a to the outside of outer peripheral case body 5. First connection terminal portion 16c is configured to extend to a position adjacent to second insertion portion 16a, and to be continuous with second insertion portion 16a.

In this instance, first connection terminal portion 16c is formed to have a wide width such that it can be connected to both first insertion portion 16a and second insertion portion 16a, thereby improving the heat dissipation of external connection terminal 6. In addition, since a single external connection terminal 6 is fixed to first and second guiding portions 5a, instead of inserting independent external connection terminals 6 into first guiding portion 5a and second guiding portion 5a, respectively, the steps of manufacturing the semiconductor device can be simplified to improve the ease of assembly.

Third Embodiment

<Configuration of Semiconductor Device>

Figure 10:
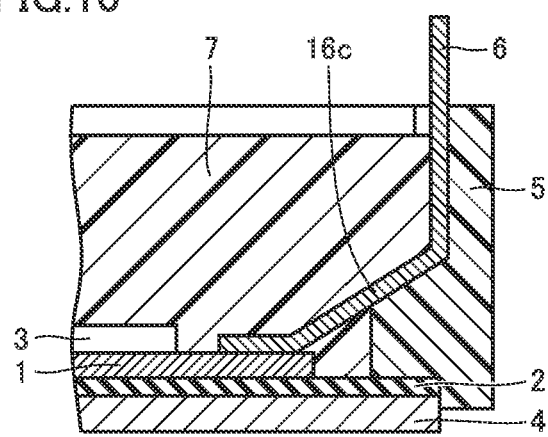
FIG. 10 is a partial schematic sectional view of a semiconductor device according to a third embodiment of the present invention.
Figure 11:
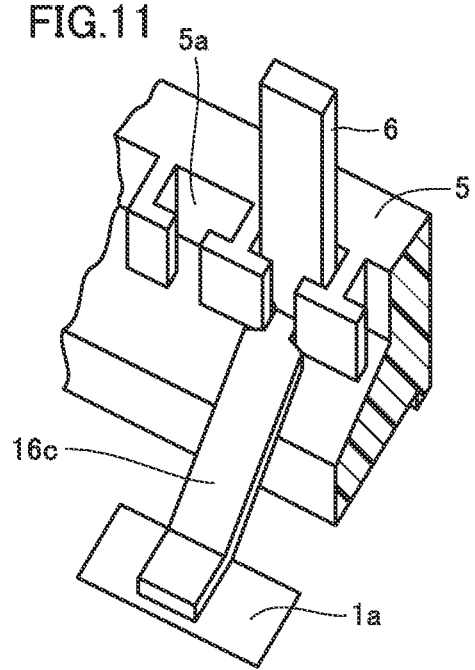
FIG. 11 is a partial schematic perspective view of the semiconductor device shown in FIG. 10.

FIG. 10 is a partial schematic sectional view of a semiconductor device according to a third embodiment of the present invention. FIG. 11 is a partial schematic perspective view of the semiconductor device shown in FIG. 10. The semiconductor device shown in FIGS. 10 and 11 basically has a configuration similar to that of the semiconductor device shown in FIGS. 1 and 2, but differs from the semiconductor device shown in FIG. 1 in the shape of external connection terminal 6 and the shape of outer peripheral case body 5. That is, in the semiconductor device shown in FIGS. 10 and 11, outer peripheral case body 5 is provided with an inclined surface in advance. External connection terminal 6 has a terminal structure in which it is disposed along the inclined surface and linearly extends to conductive pattern 1.

<Function and Effect of Semiconductor Device>

In the semiconductor device described above, first connection terminal portion 16c includes an inclined portion inclined relative to the surface of conductive pattern 1. In this instance, the length of a current path of first connection terminal portion 16c can be reduced as compared to when first connection terminal portion 16c of external connection terminal 6 is formed of a portion parallel to the surface of conductive pattern 1 and a portion perpendicular to the surface of conductive pattern 1 that are connected by a bent portion. The inductance of external connection terminal 6 can thereby be reduced.

Fourth Embodiment

<Configuration of Semiconductor Device>

Figure 12:
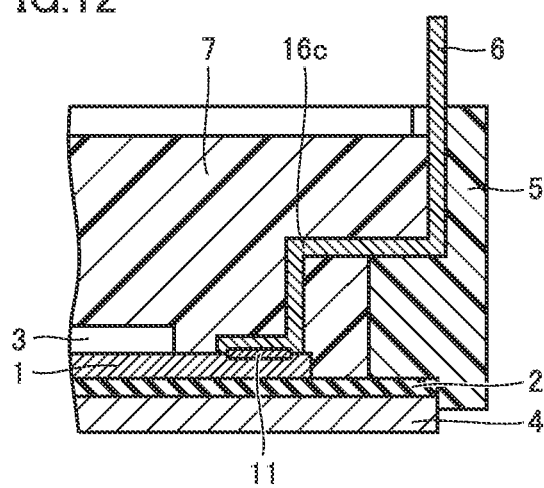
FIG. 12 is a partial schematic sectional view of a semiconductor device according to a fourth embodiment of the present invention.

FIG. 12 is a partial schematic sectional view of a semiconductor device according to a fourth embodiment of the present invention. The semiconductor device shown in FIG. 12 basically has a configuration similar to that of the semiconductor device shown in FIG. 1, but differs in the configuration of a connection portion between external connection terminal 6 and conductive pattern 1. That is, in the semiconductor device shown in FIG. 12, when connecting external connection terminal 6 and conductive pattern 1, external connection terminal 6 was disposed in contact with conductive pattern 1, then ultrasonic vibration was applied to external connection terminal 6 using a tool from above external connection terminal 6. External connection terminal 6 and conductive pattern 1 are electrically joined together by a heat welded portion 11, due to frictional heat resulting from the ultrasonic vibration. Since this ultrasonic vibration boding does not require heating and cooling steps, the steps of manufacturing the semiconductor device can be simplified.

Figure 13:
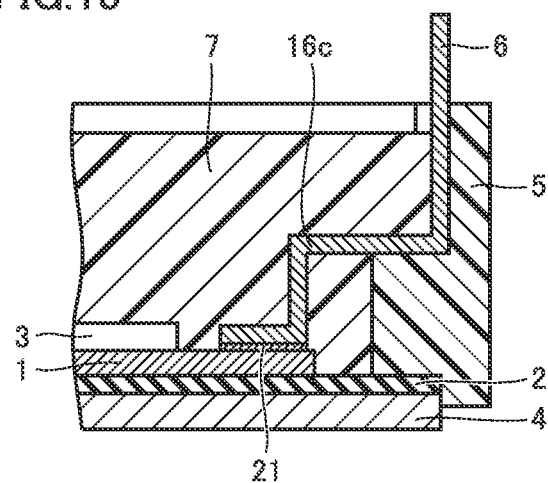
FIG. 13 is a partial schematic sectional view showing a variation of the semiconductor device shown in FIG. 12.

FIG. 13 is a partial schematic sectional view showing a variation of the semiconductor device shown in FIG. 12. The semiconductor device shown in FIG. 13 basically has a configuration similar to that of the semiconductor device shown in FIG. 12, but differs in the configuration of a connection portion between external connection terminal 6 and conductive pattern 1. That is, in the semiconductor device shown in FIG. 13, external connection terminal 6 and conductive pattern 1 are connected by solder 21. Such a connection structure can be formed through the following steps. First, solder is put on or applied to external connection terminal 6, then this external connection terminal 6 is disposed on conductive pattern 1. Then, by heating this structure to a temperature exceeding the melting point of the solder and then cooling the structure, the structure shown in FIG. 13 can be obtained.

<Function and Effect of Semiconductor Device>

In the semiconductor device described above and shown in FIG. 12, first connection terminal portion 16c is connected to conductive pattern 1 with heat welded portion 11 as an ultrasonic bonded portion interposed therebetween. In this instance, since first connection terminal portion 16c is connected to conductive pattern 1 through an ultrasonic bonding method, the step of disposing a joining material such as solder on first connection terminal portion 16c in advance can be eliminated, thereby simplifying the steps of manufacturing the semiconductor device.

In the semiconductor device described above and shown in FIG. 13, first connection terminal portion 16c is connected to conductive pattern 1 using solder 21. In this instance, first connection terminal portion 16c and conductive pattern 1 can be reliably connected through solder 21. The reliability of the semiconductor device can thereby be improved.

Fifth Embodiment

<Configuration of Semiconductor Device>

Figure 14:
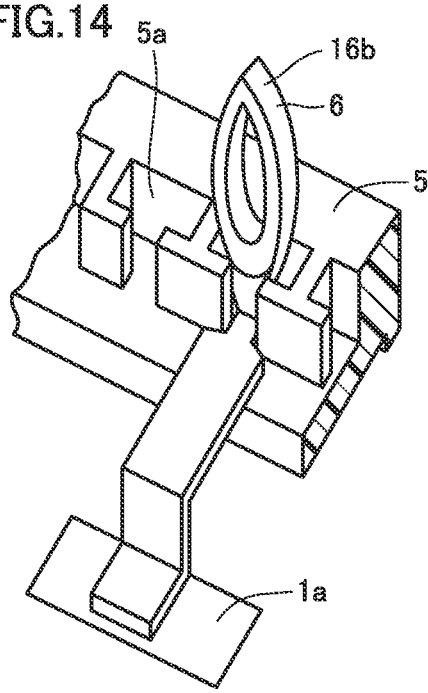
FIG. 14 is a partial schematic perspective view of a semiconductor device according to a fifth embodiment of the present invention.

FIG. 14 is a partial schematic perspective view of a semiconductor device according to a fifth embodiment of the present invention. The semiconductor device shown in FIG. 14 basically has a configuration similar to that of the semiconductor device shown in FIGS. 1 and 2, but differs from the semiconductor device shown in FIG. 1 in the shape of external connection terminal 6. That is, the semiconductor device shown in FIG. 14 uses a terminal in which external terminal portion 16b serving as an external connection portion of external connection terminal 6 has a press-fit shape. The press-fit shape refers to a structure in which external terminal portion 16b has a void region as in FIG. 14, where the terminal can bend around the void portion to have an increased or reduced length in the direction in which external terminal portion 16b extends. Examples of the press-fit shape may include a looped structure as shown in FIG. 14, a coil spring shape, or an elastically deformable bent portion.

<Function and Effect of Semiconductor Device>

In the semiconductor device described above, first external terminal portion 16b has the press-fit shape, which is an elastically deformable portion whose length can be varied in the direction in which first external terminal portion 16b extends. In this instance, when connecting first external terminal portion 16b to an external electrode or the like, first external terminal portion 16b can be reliably brought into contact with the external electrode by disposing the semiconductor device such that this first external terminal portion 16b presses against the external electrode. As a result, the reliability of electrical connection between external connection terminal 6 and the external electrode can be increased. In addition, an electrode of a control circuit board or the like that has been disposed from above external connection terminal 6 can be connected to external connection terminal 6 without a process of solder bonding and the like. The convenience of external connection terminal 6 can thereby be improved.

Although the embodiments of the present invention have been described, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A semiconductor device comprising:
    a base body;
    an insulating plate disposed on a surface of the base body;
    a conductor layer formed on a surface of the insulating plate;
    a semiconductor element connected to the conductor layer; and
    an outer peripheral case body disposed to surround an outer periphery of the base body,
    the outer peripheral case body having a plurality of recesses formed therein,
    the plurality of recesses each including an upper end opening that opens at an upper end face of the outer peripheral case body opposite to the base body,
    the outer peripheral case body having inner peripheral side openings formed in an inner peripheral surface of the case body, each side opening continuous with the upper end opening of a respective recess and extending from the upper end face toward the base body and is continuous with the respective recess,
    in a circumferential direction of the outer peripheral case body, each inner peripheral side opening has a width narrower than a width of each recess,
    the semiconductor device further comprising
    a terminal component including:
        a first insertion portion including a first portion, inserted into a first recess of the plurality of recesses in an insertion direction,
        a first external terminal portion which is continuous with the first insertion portion and extends through the upper end opening in the first recess to outside of the outer peripheral case body, and
        a first connection terminal portion, which is continuous with the first insertion portion, includes at least second and third portions, extends through the inner peripheral side opening of the first recess onto the conductor layer, and is directly connected to the conductor layer, and
    a resin layer at least sealing the semiconductor element and the first connection terminal portion in a region surrounded by the insulating plate and the outer peripheral case body, wherein
    the first portion and the third portion are wider than the second portion from one end to another end of the terminal component in a width direction perpendicular to the insertion direction.

2. The semiconductor device according to claim 1, wherein
    the base body and the insulating plate are integrated together.

3. The semiconductor device according to claim 1, wherein
    the plurality of recesses include a second recess adjacent to the first recess,
    the terminal component includes a second insertion portion inserted into the second recess, and a second external terminal portion which is continuous with the second insertion portion and extends through the upper end opening in the second recess to outside of the outer peripheral case body, and
    the first connection terminal portion is configured to extend to a position adjacent to the second insertion portion and to be continuous with the second insertion portion.

4. The semiconductor device according to claim 1, wherein
    the first connection terminal portion includes an inclined portion inclined relative to a surface of the conductor layer from the insertion portion to the conductor layer.

5. The semiconductor device according to claim 1, wherein
    a notch is formed at a boundary between the first insertion portion and the first connection terminal portion, and
    a portion of the outer peripheral case body that forms a sidewall of the inner peripheral side opening of the first recess is partially disposed on an inner side of the notch.

6. The semiconductor device according claim 1, wherein
    the first external terminal portion includes an elastically deformable portion whose length can be varied in a direction in which the first external terminal portion extends.

7. The semiconductor device according to claim 1, wherein
    the first connection terminal portion is connected to the conductor layer with an ultrasonic bonded portion interposed therebetween.

8. The semiconductor device according to claim 1, wherein
    the first connection terminal portion is connected to the conductor layer using solder.

9. The semiconductor device according to claim 1, wherein
    the case body overlaps the periphery of base body and the periphery of the insulating plate when viewed in a direction of insertion of the terminal component.

10. The device of claim 1 wherein the first connection terminal portion includes a fourth portion narrower in the width direction than the third portion and makes the direct connection to the conductive layer.

11. The device of claim 1 wherein the case body comprises a rigid material.

12. A method of manufacturing a semiconductor device, comprising:
- preparing a stacked body including a base body, an insulating plate disposed on a surface of the base body, a conductor layer formed on a surface of the insulating plate, and a semiconductor element connected to the conductor layer; and
- connecting an outer peripheral case body to the stacked body so as to surround an outer periphery of the base body,
- the outer peripheral case body having a plurality of recesses formed therein,
- the plurality of recesses each including an upper end opening that opens at an upper end face of the outer peripheral case body opposite to the base body,
- the outer peripheral case body having inner peripheral side openings formed in an inner peripheral surface of the case body, each side opening continuous with the upper end opening of a respective recess and extending from the upper end face toward the base body and is continuous with the respective recess,
- in a circumferential direction of the outer peripheral case body, each inner peripheral side opening has a width narrower than a width of each recess,
- the method further comprising
- inserting a terminal component through the upper end opening into a first recess of the plurality of recesses, the terminal component including:
  - a first insertion portion including a first portion inserted into the first recess in a first insertion direction,
  - a first external terminal portion which is continuous with the first insertion portion and extends through the upper end opening in the first recess to outside of the outer peripheral case body, and
  - a first connection terminal portion, which is continuous with the first insertion portion, includes at least second and third portions, and extends through the inner peripheral side opening of the first recess onto the conductor layer,
- the method further comprising;
  - directly connecting the first connection terminal portion and the conductor layer, and
  - forming a resin layer at least sealing the semiconductor element and the first connection terminal portion in a region surrounded by the insulating plate and the outer peripheral case body, wherein
- the first portion and the third portion are wider than the second portion from one end to another end of the terminal component in a width direction perpendicular to the insertion direction.

13. The method of manufacturing a semiconductor device according to claim 12, wherein inserting a terminal component through the upper end opening into a first recess of the plurality of recesses is performed after connecting the outer peripheral case body to the stacked body.

14. The method of claim 12 wherein the first connection terminal portion includes a fourth portion narrower than the third portion in the width direction and makes the direct connection to the conductive layer.

15. The method of claim 12 wherein the case body comprises a rigid material.

* * * * *